(12) United States Patent
Kokubun

(10) Patent No.: US 6,248,652 B1
(45) Date of Patent: Jun. 19, 2001

(54) METHOD OF MANUFACTURE OF A SEMICONDUCTOR DEVICE

(75) Inventor: Koichi Kokubun, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/452,668

(22) Filed: Dec. 1, 1999

Related U.S. Application Data

(62) Division of application No. 08/903,488, filed on Jul. 30, 1997, now abandoned.

(30) Foreign Application Priority Data

Aug. 1, 1996 (JP) .................................................... 8-203525

(51) Int. Cl.[7] .............................................. H01L 21/3205
(52) U.S. Cl. .......................................... 438/585; 438/592
(58) Field of Search ................................. 438/199, 231, 438/232, 524, 526, 700, 585, 274, 273, 546, 549, 592

(56) References Cited

U.S. PATENT DOCUMENTS

| 5,741,735 | * | 4/1998 | Violette et al. ........................ 438/279 |
| 5,747,371 | * | 5/1998 | Robb et al. ............................ 438/273 |
| 5,831,313 | * | 11/1998 | Han et al. .............................. 257/371 |
| 6,078,090 | * | 6/2000 | Williams et al. ..................... 257/476 |

* cited by examiner

*Primary Examiner*—David Nelms
*Assistant Examiner*—David Nhu
(74) *Attorney, Agent, or Firm*—Anderson, Kill & Olick P.C.

(57) ABSTRACT

The present invention is directed to a method of manufacture of a semiconductor device which is immune to short-channel effects including forming a first, second and third dielectric layers one conductivity type semiconductor substrate with the first dielectric layer forming a gate dielectric film on a surface of the one conductivity type semiconductor substrate, forming a groove in the second and third dielectric layer which exposes the first dielectric layer and forming a heavily doped region through the groove so that the width of the heavily doped region equals the width of the groove. The heavily doped region is of the same conductivity type as the semiconductor substrate.

10 Claims, 8 Drawing Sheets

METHOD OF MANUFACTURE OF A SEMICONDUCTOR DEVICE

This application is a division of Ser. No. 08/903,488 filed Jul. 30, 1997 abandoned.

BACKGROUND OF THE INVENTION

1. Field of Invention

The present invention relates to a semiconductor device and to a method of manufacturing a semiconductor device and more specifically to a MOSFET for controlling short-channel effects.

2. Description of Related Prior Art

As miniaturization of semiconductor IC's advance, controlling short channel effects of MOS transistors is critical in terms of guaranteeing values for cutoff properties and threshold voltage.

The short-channel effect is the phenomena observed in the shorter gate for MOS transistors as a result of miniaturization, in which the lateral widening of the depletion region of a drain diffusion layer comes close to the depletion region of the source diffusion layer, causing punchthrough or bipolar behavior. This causes current leakage and makes it impossible for the gate voltage to control current flow, which lowers the threshold voltage.

Therefore, suppressing the depletion region of the conductive source/drain diffusion layer and specifically decreasing the depletion region is effective in suppressing short-channel effects. A MOS transistor of conventional technology is illustrated in FIG. 6, in which the lateral width of the depletion region 29 is controlled to decrease short-channel effects.

A heavily doped p+ region 11 is formed deep in the depletion region 29. When the p+ region 11 has the same height as the diffusion layer 12, this is a situation which makes the lateral widening of the depletion region difficult.

The structure illustrated in FIG. 6 is formed by a mask aligning technique using the ion implantation method. As is clear in FIG. 6, ions are implanted wider than required, which takes the depletion region into account. A heavily doped region is also formed under the drain layer, generating junction capacity between the diffusion layer (source/drain layer) and the heavily doped region. This junction capacity impedes an increase in the device operation speed.

A technology designed to decrease the junction capacity between a heavily doped region and a diffusion layer is disclosed in Japanese patent Kokai H7-183392. This technology is briefly described herein in connection with FIG. 7(a–c). As illustrated in FIG. 7(a), a device isolation dielectric layer 2 is formed by a normal LOCOS method on a p-type semiconductor substrate 1 to provide a gate dielectric layer 3 by a thermal oxidation method. Then, by an ion implantation method, a p-type heavily doped region 4 is formed having a higher dopant concentration than that of the semiconductor substrate 1. After that; gate electrodes 5 are formed at predetermined locations.

Next, as illustrated in FIG. 7(b), elements such as Si and Ar are implanted, using the gate electrodes 5 as masks, to purposely form point defects, e.g. voids of interstitial Si, on the surface of a semiconductor substrate 1 except directly below the gate electrodes 5. Immediately after this, these point defects are annealed by oxidation ambiance. Consequently, the point defects are diffused at an accelerated rate to lower the concentration peak in the heavily doped region while the point defects amass on the surface of the semiconductor substrate, leaving a p-type heavily doped region 4 only directly under the gate electrodes 5.

Then, using the gate electrode as a mask, a dopant is introduced to form a diffusion layer 6 which is used as a source/drain (FIG. 7(c)).

The AB cross section of FIG. 7(c) is profiled in FIG. 8. In FIG. 8, the y-axis shows dopant concentrations while the x-axis shows position location from point A to point B.

As is apparent in the method described above, the concentration peak is lowered by introducing point defects on the surface of a semiconductor substrate 1 and by annealing it to accelerate the diffusion of the dopant in the heavily concentrated region except directly under the gate electrode 5 (FIG. 7(c)). That is, the part of the dopant in the heavily doped region 4, except the part directly under the gate electrode 5, has a lower but still noticeable concentration of dopant. FIG. 8 shows this status.

Therefore, it is possible to reduce the junction capacity between the diffusion layer 6 and the heavily doped region 4, while still retaining the junction capacity.

The present invention intends to resolve the above mentioned problems and to provide a MOSFET structure which is substantially immune to short-channel effects and thereby permitting an increase in the operational speed of the semiconductor device.

It is accordingly an object of this invention to provide a semiconductor device comprising diffusion layers of the inverse conductivity type formed at a predetermined distance on the surface of one conductivity type semiconductor substrate. A gate electrode is formed between the diffusion layers. A heavily doped region of the same conductivity type as the semiconductor substrate is formed under the gate electrode such that it does not contact the diffusion layer (source/drain). The dopant concentration drops significantly at the junction between the heavily doped region and the semiconductor substrate relative to the dopant concentration in the heavily doped region.

SUMMARY OF THE INVENTION

The method of manufacturing a semiconductor device in accordance with the present invention comprises the steps of:

forming a first dielectric layer to be a gate dielectric film on a one conductivity type semiconductor substrate;

forming a second dielectric layer on the dielectric layer;

forming a third dielectric layer on the second dielectric layer;

forming a groove in the second and third dielectric layer to a depth which exposes the first dielectric layer;

forming a heavily doped region located at a predetermined depth from the surface of the one conductivity type semiconductor substrate below the groove in the one conductivity type semiconductor substrate, having the same conductivity type dopant as the one conductivity semiconductor substrate and having a higher dopant concentration than that of the one conductivity semiconductor substrate;

forming an electrode material into the groove;

removing the second and third dielectric layers; and forming diffusion layers by introducing an opposite type dopant into the one conductivity type semiconductor substrate using the electrode material as a mask. A dielectric layer herein refers to an electric insulator. Therefore, the dielectric layer is a preferred insulating layer.

The present invention also encompasses a semiconductor device which comprises:

one conductivity type semiconductor substrate having at least two diffusion layers of the opposite conductivity type;

a gate electrode formed on the one conductivity type semiconductor substrate though a dieltric layer between the two diffusion layers;

a heavily doped region of the same conductivity type as the semiconductor substrate below the gate electrode and spaced apart from the diffusion layers, with the dopant concentration dropping significantly at the junction between the heavily doped region and the semiconductor substrate relative to the dopant concentration in the heavily doped region.

The semiconductor device of the present invention also comprises:

a one conductivity type semiconductor substrate having diffusion layers thereon for use as a source/drain;

a dielectric layer formed on the one conductivity type semiconductor substrate;

a gate electrode which is located above the dielectric layer;

a heavily doped region which is formed under and as wide as the gate electrode, and wherein the heavily doped region and the gate electrode are of the same conductivity type as the semiconductor substrate and the heavily doped region is spaced apart from the diffusion layers wherein the dopant concentration drops significantly at the junction between the heavily doped region and the semiconductor substrate relative to the dopant concentration in the heavily doped region.

BRIEF DESCRIPTION OF THE PREFERRED EMBODIMENTS

Figure 1A:
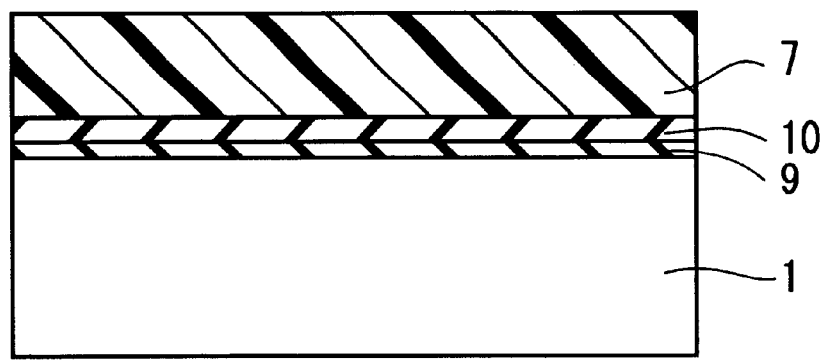
FIGS. 1(a)–1(e) show a sequence of diagrams illustrating the method of manufacturing the semiconductor device of the first embodiment of the present invention.

Now, embodiments of the present invention are described in detail referring to the drawings.

As illustrated in FIG. 1(a), an insulating layer 9 of preferably dielectric material (e.g. silicon dioxide layer) of about 10 nm thickness is formed on a p-type semiconductor substrate 1 by using a heat oxidation method, an insulating layer 10 of preferably dielectric material (e.g. nitride layer) of about 50 nm thickness is formed on layer 9 by using a CVD method and a thicker insulating layer 7 of preferably dielectric material (e.g. silicon dioxide) of about 500 nm is formed over the layer 9 by a CVD method.

Figure 1B:
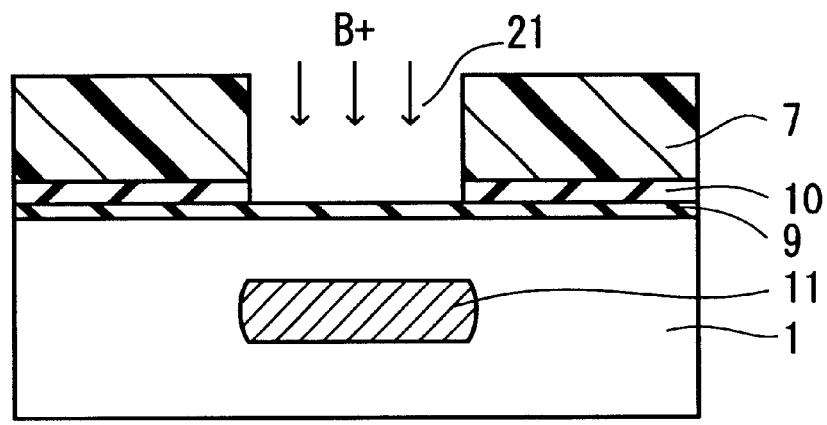

As illustrated in FIG. 1(b), by using a photolithography method, the layers 7 and 10 at predetermined locations are removed to form a groove 21. Then, using the thicker layer 7 as a mask, a dopant (e.g. Boron ion) is introduced into the semiconductor substrate 1 by using an ion implantation method (accelerated energy 60 kev, dose quantity $8\times10^{12}$ $cm^{-2}$) and a heat treatment is performed to form a p-type of heavily doped region 11, which is the same type as the semiconductor substrate 1.

Now, the heavily doped region 11 should be located at a predetermined depth below the layer 9.

In addition, when a high voltage is supplied to a drain terminal (not illustrated), the heavily doped region 11 serves to suppress the widening of a depletion layer which would alter the diffusion layer (source/drain) on the substrate 1. Therefore, to suppress widening of the depletion layer, it is advantageous that the heavily doped region 11 be separated from the dielectric layer 9 by a sufficient distance. It is especially advantageous for the heavily doped region 11 to have about the same height as the distance from the bottom of dielectric layer 9 to the top of the heavily doped region 11.

The heavily doped region 11 which has a higher concentration than the dopant concentration of the p-type semiconductor substrate 1 effectively suppresses the widening of the aforementioned depletion layer.

Figure 1C:
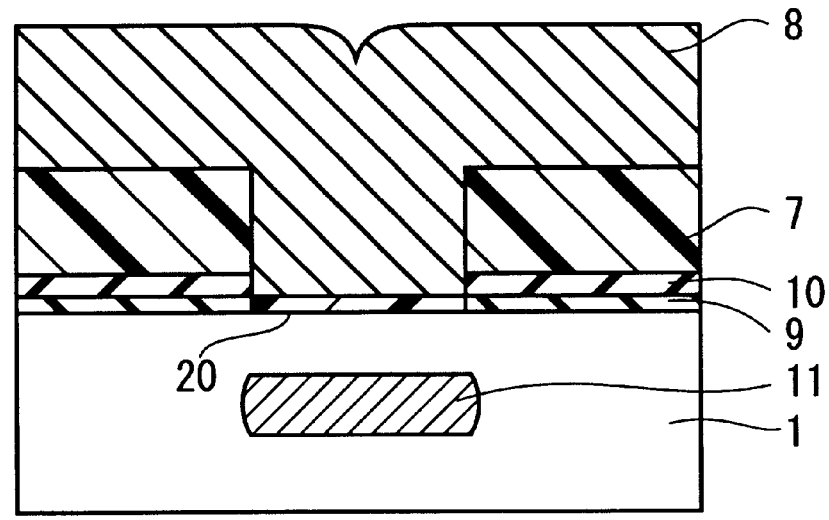

Then, as illustrated in FIG. 1(c), the dielectric layer 9 at the bottom of the groove 21 of FIG. 1(b) is removed by an anisotropic etching method (e.g. reactive ion etching), and again, a thin dielectric layer 20 is formed there. Then an electrode material (e.g. polysilicon) 8 of about 200 nm thickness is deposited by using a CVD method.

When forming the heavily doped region 11, if the accelerated energy or dose quantity of Boron ions to be implanted is not too large, an electrode material may be deposited without removing the thin dielectric layer 9 from the bottom of the groove 21.

Figure 1D:
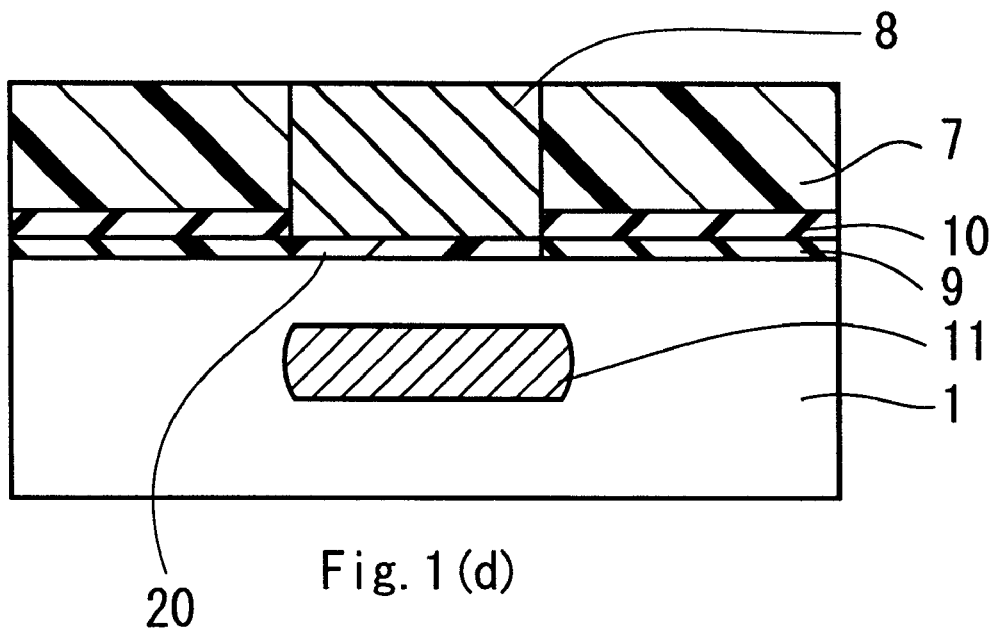

As illustrated in FIG. 1(d), a gate electrode is formed by polishing the electrode material 8 until the surface of the thick dielectric layer 7 is exposed by using a CMP (chemical-mechanical polishing) method.

Here, the electrode material 8 is planed by using a CMP method, but it can be planed by other methods, (e.g. etch-back method).

Also, if the electrode material 8 requires further thinning after planing for exposing the thick dielectric layer 7, the electrode material 8 may be selectively etched to form a gate electrode of predetermined thickness.

Figure 1E:
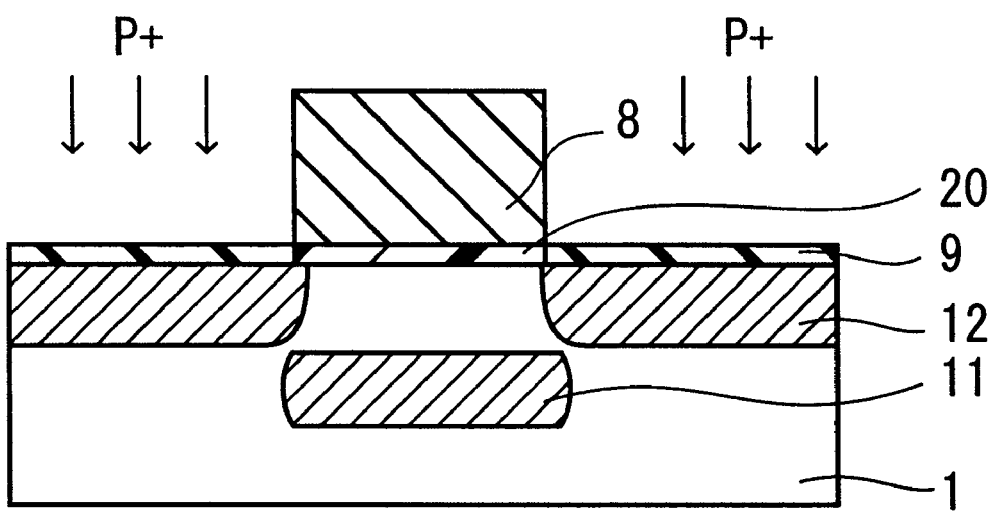

As illustrated in FIG. 1(e), the dielectric layer 7 is etched off, by using ammonium fluoride for about 5 minutes, and the dielectric layer 10 is also etched off by using isotropic dry etching or phosphoric acid at 165° C. for about 9 minutes, to leave the electrode material 8 standing alone above dielectric layer 20. Then, by using the electrode material 8 as a mask, ions are introduced to produce a diffusion layer 12 (source/drain).

As is apparent from the above description, in this embodiment, a heavily doped region self-aligns itself and there is no need for adding anymore manufacturing steps.

Also in the embodiment, a groove is formed on a dielectric layer; a heavily doped region 11 is formed using the dielectric layer 7 as a mask, (See FIG. 1(b)) and an electrode material 8 is filled into the groove 21 to form a gate electrode. According to this embodiment, therefore, the heavily doped region 11 is formed directly under the electrode material 8 which is to be the gate electrode. With this method, overlaps which were common in conventional technique will not occur during the formation of a heavily doped region, thus, eliminating a need for providing a sacrificial margin to the width of the heavily doped region for overlap compensation.

As a result, a predetermined distance is maintained between the heavily doped region 11 and diffusion layers 12, suppressing the junction capacity between the heavily doped region and the diffusion layer. Also, in this embodiment, unlike conventional technology, the dopant concentration drops significantly at the junction between the heavily doped region 11 and the semiconductor substrate 1 relative to the dopant concentration in the heavily doped region 11. This suppresses the junction capacity more effectively than does conventional technology.

The second embodiment is described in detail referring to FIGS. 2(a–e) in the drawings. As illustrated in FIG. 2(a), an electrode material 8 (e.g. polysilicon, about 200 nm) is filled into a groove, in the same manner as FIG. 1(a) through 1(d) of the first embodiment, and is selectively etched to a predetermined thickness (polysilicon, about 100 nm).

Figure 2A:
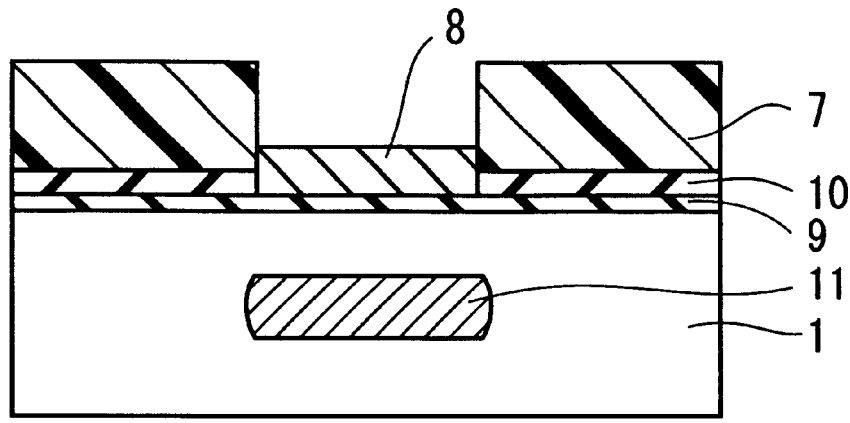
FIGS. 2(a)–2(e) show a sequence of diagrams illustrating the method of manufacturing the semiconductor device of the second embodiment of the present invention.
Figure 2B:
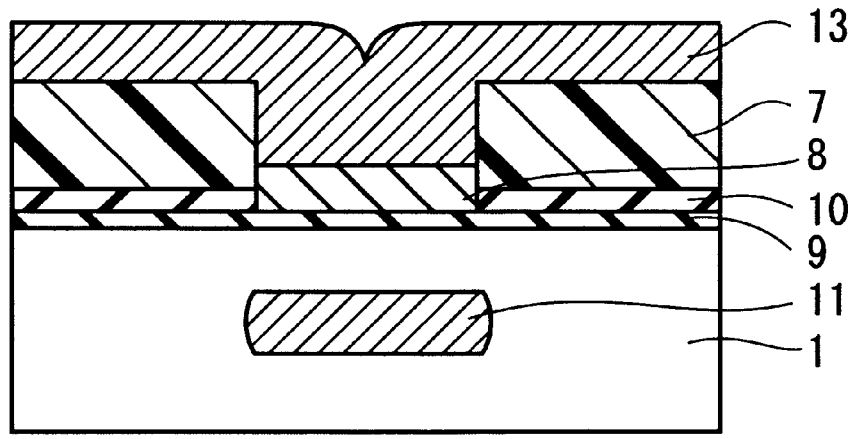

As illustrated in FIG. 2(b), by sputtering diffusion, a metal suicide layer 13 (e.g. metal silicide layer such as WSi) of 100 nm thickness is deposited.

Figure 2C:
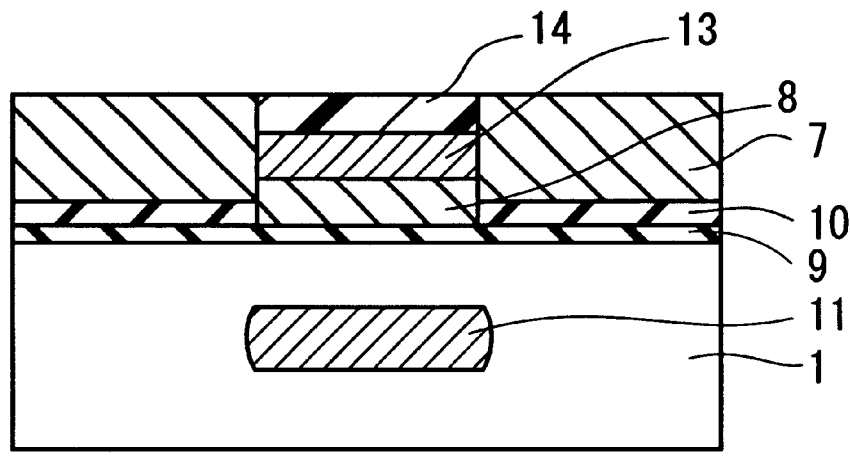
Figure 2D:
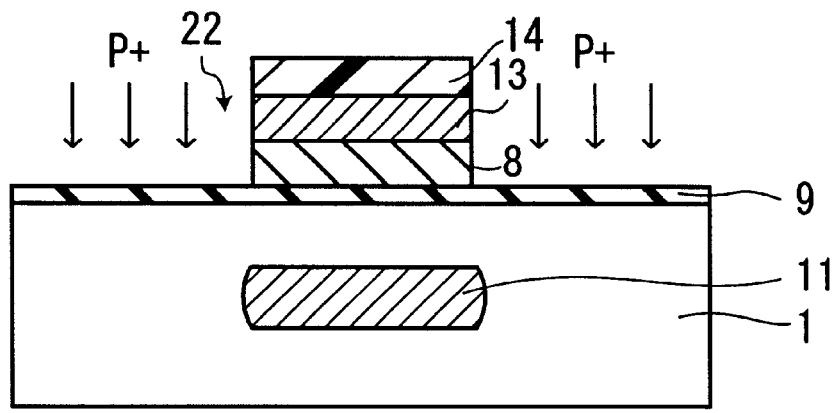

Then, as illustrated in FIG. 2(c), the metal silicide layer 13 is etched to a predetermined depth, and a dielectric layer 14 (e.g. nitride layer) is deposited to form a gate electrode 22 as is identified in FIG. 2(d) representing the tandem arrangement of the electrode material 8, the silicide layer 13 and the dielectric layer 14.

Note that the dielectric layer 14 is used as a cap material for a self-aligned contact (SAC). Without the need for a SAC, there is no need to have a cap material.

Figure 2E:
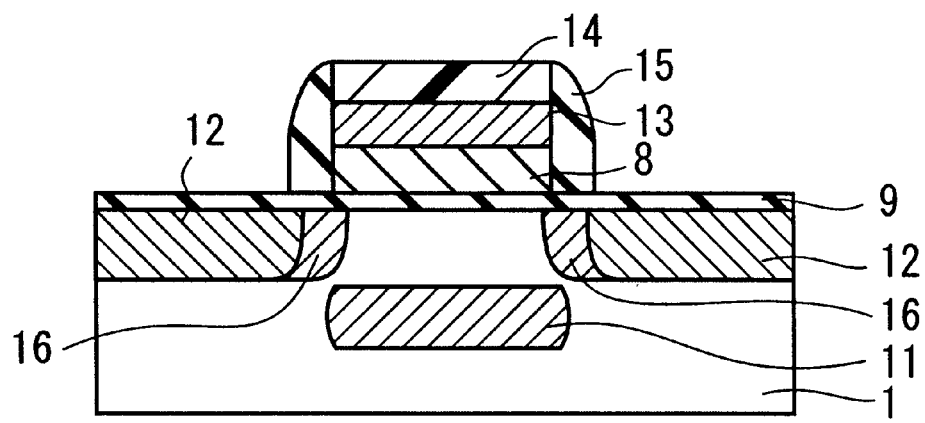

The dielectric layers 7 and 10 from FIG. 2(c) are etched off, as illustrated in FIG. 2(d), and implant ions of low concentration are implanted (accelerated energy 20 Kev, dose quantity $4 \times 10^{13}$ cm$^{-2}$, phosphorous) using the gate electrode 22 as a mask to form a diffusion layer 16 as shown in FIG. 2(e).

As further illustrated in FIG. 2(e), a dielectric sidewall 15 (e.g. nitride layer of about 300 nm) is formed on the sides of the gate electrode 22. Ions are implanted (accelerated energy 20 Kev, dose quantity $4 \times 10^{15}$ cm$^{-2}$ phosphorous) and a high temperature treatment is performed to form a diffusion layer 12.

A MOS transistor is formed in the above manner, wherein the MOS transistor has a LDD structure having a polycide gate and a heavily doped region of the opposite conductivity type from a source/drain layer. The heavily doped region is self-aligned at a location deeper than the depletion region and its length is about the same as the length of the gate electrode and does not come in contact with the diffusion layer.

The embodiments mentioned above were n-type MOS transistors, however, the invention applies equally as well to p-type MOS transistors.

For p-type MOS of the buried channel type, ion implantation may be performed to form a buried channel after implanting ions for the heavily doped region formation.

In the above embodiment, a metal suicide layer is used for a part of the gate electrode, however a metal layer having a high melting point may be used as well.

As is apparent from the above description, a heavily doped region self-aligns itself and there is no need for significant increase in any of the manufacturing steps.

Also, there is no risk for generating overlaps during the formation of the doped region and there is no need for providing any sacrificial margin to the width of the heavily doped region for overlap compensation.

As a result, a separation of a certain distance is maintained between the heavily doped region and a diffusion layer. This separation distance suppresses the junction capacity between the heavily doped region and the diffusion layer.

Unlike the embodiments of the conventional technology, the dopant concentration drops significantly at the junction between the heavily doped region 11 and the semiconductor substrate 1 relative to the dopant concentration in the heavily doped region 11. This sharp change, suppresses the junction capacity more effectively than conventional technology.

Figure 3:
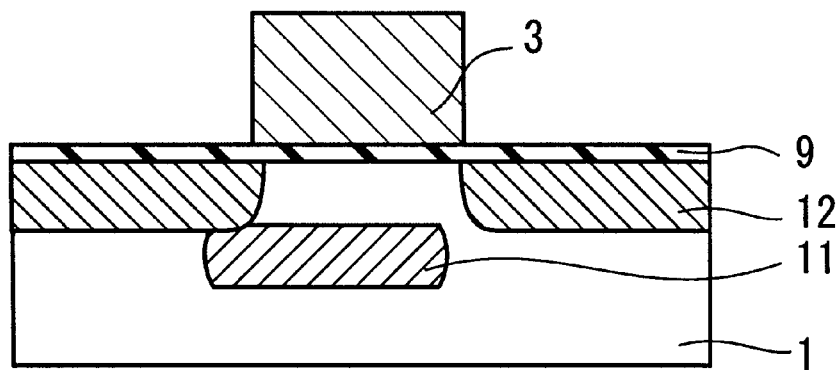
FIG. 3 shows a diagram illustrating the semiconductor device of the third embodiment of the present invention.

A third embodiment of the present invention, is described in detail referring to FIG. 3 in the drawings. As illustrated in FIG. 3, a heavily doped region is formed adjacent to or much closer to one of the two diffusion layers 12. In this structure a punchthrough is suppressed without increasing one of the two junction capacities.

Normally, a high voltage is supplied to the drain side of a MOS transistor, knowing that a depletion layer (not illustrated) widens from the drain side to the substrate side, it is important that the junction capacity on the drain side is suppressed to increase the operational speed of the semiconductor device. Therefore, it is effective for suppressing the junction capacity that a heavily doped region is close to the source side.

The manufacturing method of a semiconductor device as illustrated in FIG. 3 remains the same as that of the method illustrated in FIGS. 1(a) to 1(e) except that ions are introduced in a slanted direction relative to the surface of the semiconductor device to form the heavily doped region offset from the center of the semiconductor device. The heavily doped region should preferably overlap the diffusion layer 12 as shown in FIG. 3.

This method of manufacturing may be applied to a semiconductor device having a LDD structure.

Figure 4A:
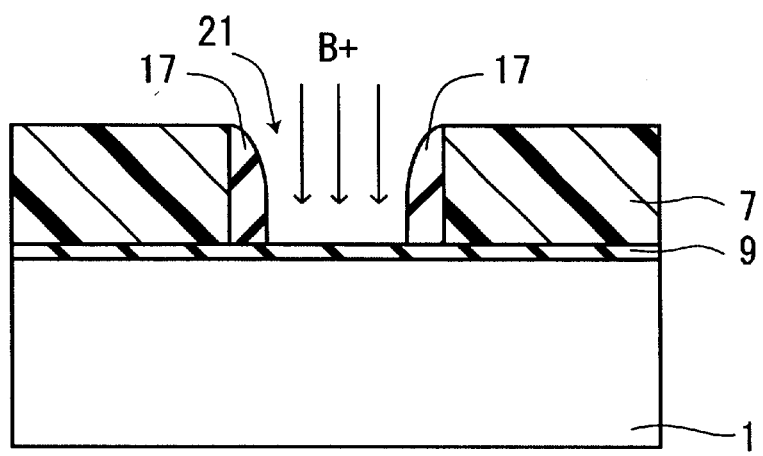
FIGS. 4(a) and 4(b) show a sequence of diagrams illustrating the method of manufacturing a semiconductor device of the fourth embodiment of the present invention.
Figure 4B:
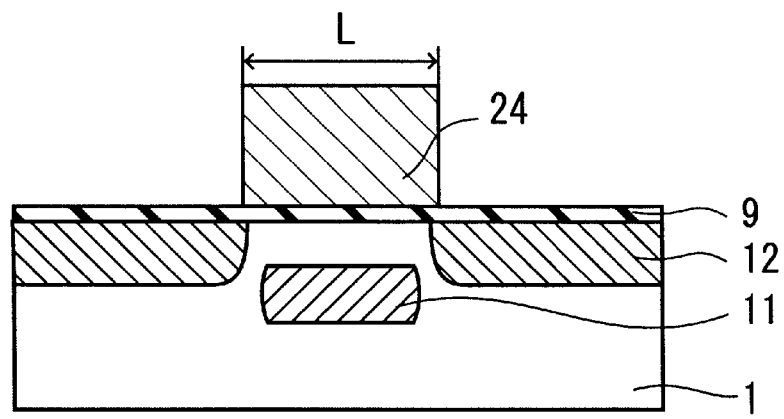

Now, a fourth embodiment is described in detail referring to FIG. 4(a–b) in the drawings. As illustrated in FIG. 4(a), a dielectric layer 9 (e.g. silicon oxide layer) is formed on a semiconductor substrate 1, a thick dielectric layer 7 (e.g. oxide layer) is formed on a dielectric layer 9, a groove 21 is formed in the thick dielectric layer 7 deep enough to expose the dielectric layer 9 (e.g. oxide layer), a nitride layer 17 of about 30 nm thickness is deposited and RIE (reactive ion etching) is performed leaving the nitride layer 17 on the sidewalls of the groove 21. Ions are then implanted such that the heavily doped region 11 is shorter than the gate length L and has the same conductive type as the semiconductor substrate 1.

This can be applied to a semiconductor device having the LDD structure illustrated in FIGS. 2(d) & 2(e) as described above.

In this embodiment, the punchthrough is suppressed without increasing the junction capacity at the border, with a diffusion layer 12.

Also in this embodiment, a groove 21 is formed into a dielectric layer 7. A heavily doped region 11 is formed using the groove 21 and an electrode material 24 is filled into the groove 21 to form a gate electrode. According to this embodiment, the heavily doped region 11 is formed directly under the electrode material 24. With this method, overlaps which were common in conventional techniques will not occur during the formation of a heavily doped region, thus, eliminating a need for providing a sacrificial margin to the width of the heavily doped region for overlap compensation.

Moreover, in this embodiment, unlike conventional technology, the dopant concentration changes sharply at a point between the heavily doped region 11 and the semiconductor substrate 1. This suppresses the junction capacity more effectively than conventional technology.

Figure 5:
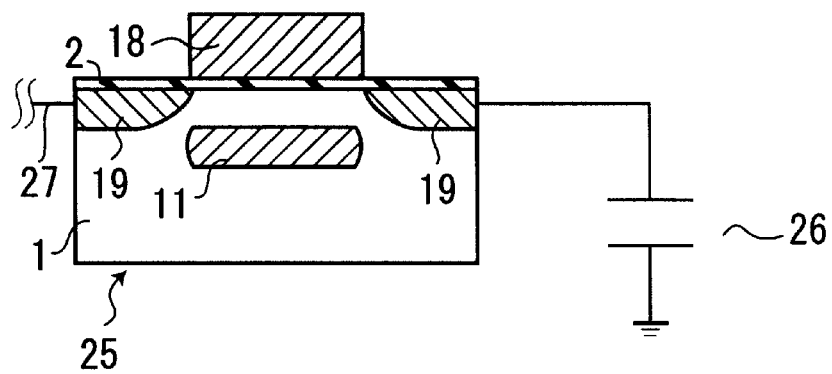
FIG. 5 shows a diagram illustrating the semiconductor device of the fifth embodiment of the present invention.
Figure 6:
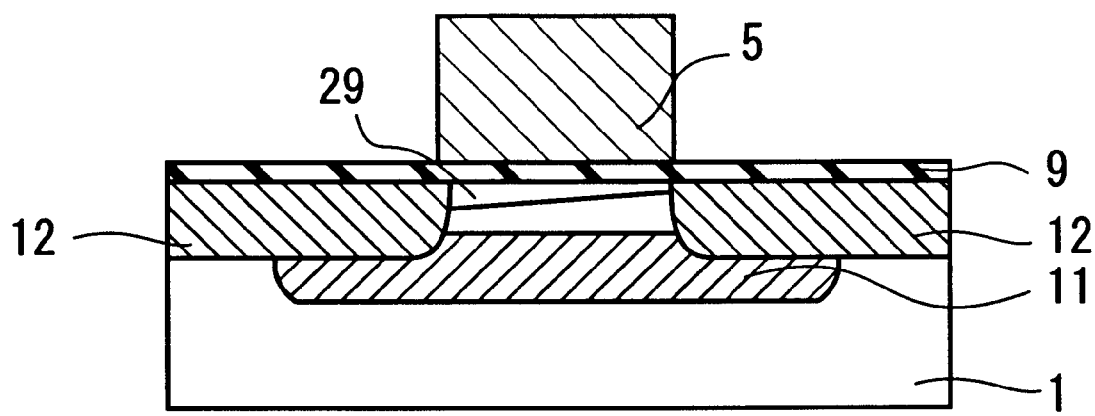
FIG. 6 shows a diagram illustrating a semiconductor device of conventional technology for suppressing short-channel effects.
Figure 7A:
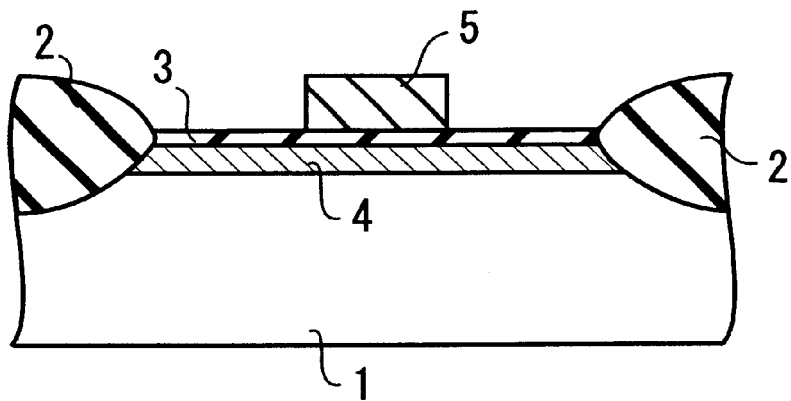
FIGS. 7(a)–7(c) show a sequence of diagrams illustrating a method of manufacturing a semiconductor device of conventional technology for suppressing short-channel effects.
Figure 7B:
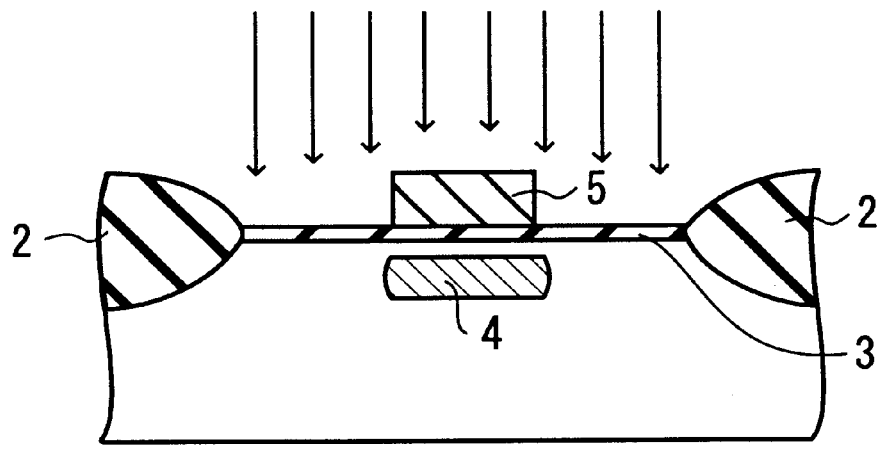
Figure 7C:
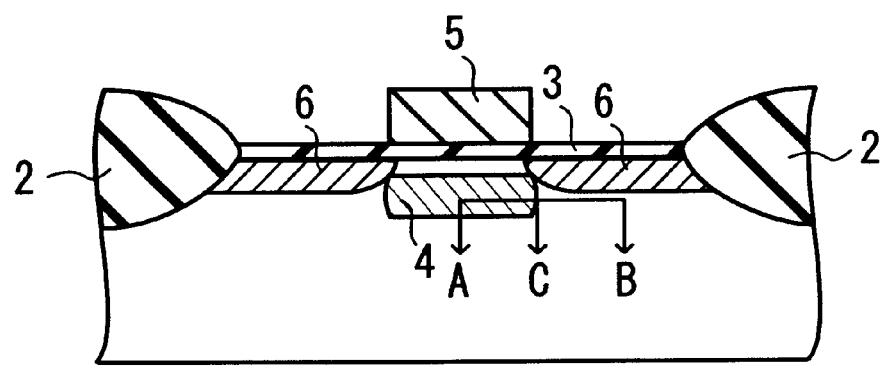
Figure 8:
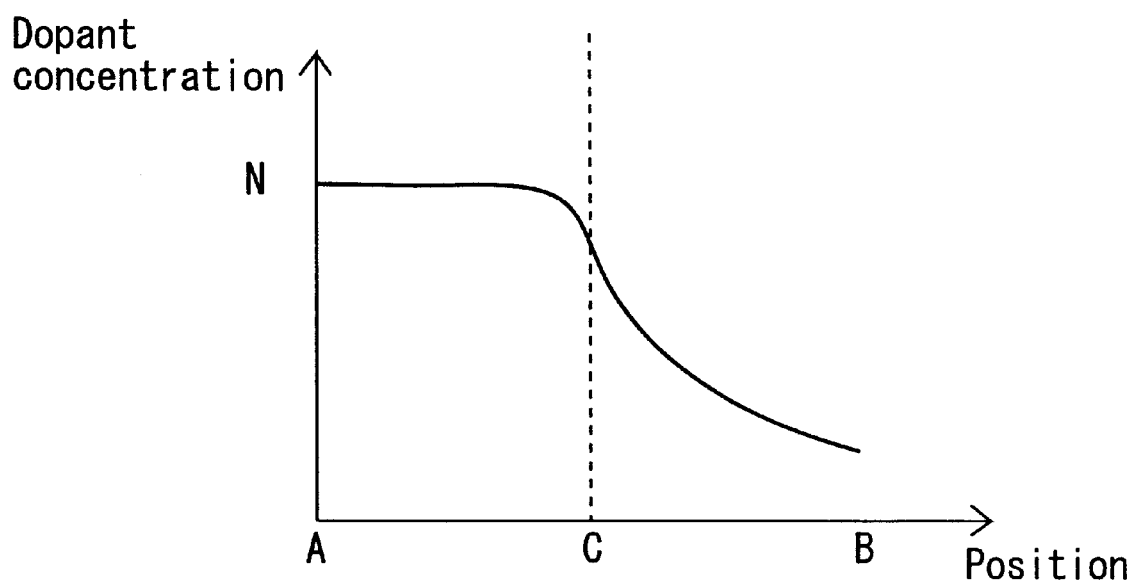
FIG. 8 shows a diagram illustrating the profile of the AB cross section of FIG. 7(c).

Now, a fifth embodiment is described in detail referring to FIG. 5. FIG. 5 illustrates a schematic diagram of a dynamic memory cell formed with a MOS transistor 25 for data transfer and a capacitor 26 for data storage. Note that a MOS transistor for data transfer comprises the aforementioned heavily doped region 11. Also, a gate electrode 18 is used as a word selection line. One end of a diffusion layer 19 (source/drain) is connected to a bit line 27. 28 is a dielectric layer.

Because a dynamic memory cell stores data using charging and discharging of a capacitor's electrons, it is inevitable that the operation speed slows down.

When forming a heavily doped region on a MOS transistor 25 for data transfer which suppresses short-channel effects due to the junction capacity that exists between the heavily doped region and a diffusion layer. The operation speed for a dynamic memory cell formed with a MOS transistor due to the junction capacity slows down even more rapidly.

However, in this embodiment, a MOS transistor for data transfer has the aforementioned heavily doped region 11, and does not contact a diffusion layer 19 or a bit line 27, eliminating the formation of a junction capacity. Therefore, slowing down of the operation speed can be prevented.

The semiconductor device of the present invention can suppress short-channel effects because the heavily doped region is formed directly under a gate electrode.

Unlike conventional technology, the dopant concentration drops significantly at the junction between the heavily doped region 11 and the semiconductor substrate 1 relative to the dopant concentration in the heavily doped region 11, effectively suppressing the junction capacity.

In addition, the fact that the heavily doped region self-aligns itself reduces the chance of overlapping with a gate electrode.

Moreover, this embodiment of the present invention relates to a dynamic memory cell (DRAM), however, it can also be applied to such devices as SRAM and LOGIC.

What is claimed is:

1. A method of manufacturing a semiconductor device comprising the steps of:

forming a first dielectric layer to be a gate dielectric film on a surface of a one conductivity type semiconductor substrate;

forming a second dielectric layer on said first dielectric layer;

forming a third dielectric layer on said second dielectric layer;

forming a groove of predetermined width, in said second and third dielectric layer to a depth which exposes a surface of said first dielectric layer;

forming a heavily doped region in said semiconductor substrate through said groove, the heavily doped region being located at a predetermined depth from said surface of said semiconductor substrate below said groove, having the same conductivity type as said semiconductor substrate and having a higher dopant concentration than that of said semiconductor substrate, with the width of the heavily doped region being substantially equal to the width of the groove;

forming an electrode material in said groove;

removing said second and third dielectric layers; and forming diffusion layers by introducing an opposite type dopant into said semiconductor substrate using said electrode material as a mask.

2. The method of claim 1, wherein in the step of forming said electrode material, said electrode material is formed of multi-layers.

3. The method of claim 2, wherein said multi-layers of electrode materials comprise two layers of a polysilicon and a metal layer having a high-melting point.

4. The method of claim 1, wherein said first and third dielectric layers, are made of silicon oxide and said second dielectric layer is made of silicon nitride.

5. The method of claim 1, after forming said diffusion layer, further comprising the steps of; forming first sidewalls on side surfaces of a gate electrode and forming a second diffusion layer in the surface of said semiconductor substrate using said first sidewalls and said gate electrodes as masks.

6. The method of claim 1, wherein the step of forming a heavily doped region, impurities are introduced in a slanted direction relative to the longitudinal axis extending through the center of said groove.

7. The method of claim 1, wherein before the step of forming a heavily doped region at a predetermined depth in said semiconductor substrate, second sidewalls are formed on side surfaces of said groove and after forming the heavily doped region, removing the second sidewalls formed on the side surfaces of said grooved.

8. The method of claim 7, wherein the step of forming said heavily doped region, said diffusion layer is formed such that a position of an upper surface of the heavily doped region and a position of a lower surface of said diffusion layer are substantially equal.

9. The method of claim 1, wherein after or during the step of forming said heavily doped region, said diffusion layer is formed such that a position of an upper surface of the heavily doped region and a position of a lower surface of said diffusion layer are substantially equal.

10. The method of claim 8, wherein the step of forming said electrode material, after said first dielectric layer in said groove is removed, a fourth dielectric layer is formed on said semiconductor substrate in said groove, and then the electrode material is formed in said groove.

* * * * *